(12) United States Patent
Lee

(10) Patent No.: US 8,422,314 B2
(45) Date of Patent: Apr. 16, 2013

(54) DEVICE AND METHOD FOR ACHIEVING SRAM OUTPUT CHARACTERISTICS FROM DRAMS

(76) Inventor: Seong Jae Lee, Daejeon (KR)

(*) Notice: Subject to any disclaimer, the term of this patent is extended or adjusted under 35 U.S.C. 154(b) by 157 days.

(21) Appl. No.: 13/118,287

(22) Filed: May 27, 2011

(65) Prior Publication Data

US 2011/0228613 A1 Sep. 22, 2011

Related U.S. Application Data

(63) Continuation of application No. PCT/KR2010/003151, filed on May 19, 2010.

(30) Foreign Application Priority Data

May 25, 2009 (KR) .................. 10-2009-0045298

(51) Int. Cl.
G11C 7/10 (2006.01)

(52) U.S. Cl.
USPC ............... 365/189.04; 365/189.18; 711/106

(58) Field of Classification Search ............. 365/189.04, 365/189.18; 711/105, 106; 714/6.22, 6.23
See application file for complete search history.

(56) References Cited

U.S. PATENT DOCUMENTS

| | | | | |
|---|---|---|---|---|
| 5,926,827 | A * | 7/1999 | Dell et al. .................. | 711/105 |
| 6,046,952 | A * | 4/2000 | Novak et al. ............... | 365/222 |
| 6,262,940 | B1 | 7/2001 | Choi et al. | |
| 6,928,512 | B2 | 8/2005 | Ayukawa et al. | |
| 7,130,229 | B2 * | 10/2006 | Dahlen et al. .............. | 365/200 |
| 7,194,568 | B2 * | 3/2007 | Jeter et al. ................. | 711/5 |

(Continued)

FOREIGN PATENT DOCUMENTS

| | | |
|---|---|---|
| JP | 2000-315174 A | 11/2000 |
| JP | 2003-006041 A | 1/2003 |

(Continued)

OTHER PUBLICATIONS

English Translation of PCT Preliminary Report on Patentability dated Jun. 12, 2011 in corresponding PCT/KR2010/003151 filed May 19, 2010.*

(Continued)

Primary Examiner — Tuan T Nguyen
Assistant Examiner — Lance Reidlinger
(74) Attorney, Agent, or Firm — Knobbe Martens Olson & Bear, LLP

(57) ABSTRACT

A method is provided for achieving SRAM output characteristics from DRAMs, in which a plurality of DRAMs are arranged connected in parallel to a controller in such a way as to be able to obtain SRAM output characteristics using the DRAMs, comprising a process in which data is output to an external device when a control signal for data reading has been input from the external device, by sequentially repeating a step in which the controller sends a data output state control signal to one DRAM and sends a refresh standby state control signal to the other DRAMs, the data is read and sent to the external device from the DRAM in the output state, and a refresh standby state control signal is sent to the DRAM which was in the output state while an output state control signal is sent to another DRAM and data is read out from the DRAM in the output state, and a step in which the controller sends a control signal for changing the output state to the refresh standby state.

9 Claims, 3 Drawing Sheets

U.S. PATENT DOCUMENTS

| | | |
|---|---|---|
| 7,454,555 B2 * | 11/2008 | Ware et al. .................. 711/5 |
| 7,461,216 B2 * | 12/2008 | Sved et al. .................. 711/154 |
| 7,694,093 B2 * | 4/2010 | Shaw et al. .................. 711/162 |
| 2002/0199056 A1 | 12/2002 | Ayukawa et al. |
| 2003/0070055 A1 * | 4/2003 | Johnson et al. .............. 711/202 |
| 2005/0138276 A1 * | 6/2005 | Navada et al. ............... 711/105 |

FOREIGN PATENT DOCUMENTS

| | | |
|---|---|---|
| JP | 2003-297082 A | 10/2003 |
| JP | 2008-257742 A | 10/2008 |
| KR | 10-2000-0065602 A | 11/2000 |
| KR | 10-2002-0088652 A | 11/2002 |
| KR | 10-2003-0011231 A | 2/2003 |
| KR | 10-2003-0088020 A | 11/2003 |

OTHER PUBLICATIONS

International Search Report dated Dec. 27, 2010 of PCT/KR2010/003151 (4 pages).

* cited by examiner

| | Period 0 (t=0) | Period 1 (t=1) | Period 2 (t=2) | Period 3 (t=3) | ... | Reference |
|---|---|---|---|---|---|---|
| DRAM 0 | DATA Output | Refresh, Idle | DATA Output | Refresh, Idle | ... | Normal DRAM operation |
| DRAM 1 | Refresh, Idle | DATA Output | Refresh, Idle | DATA Output | ... | Normal DRAM operation |
| Actual Output | DATA Output | DATA Output | DATA Output | DATA Output | ... | Output, such as SRAM DATA |

Figure 2

| | Period 0 (t=0) | | | | | | Period 1 (t=1) | | | | | | Period 2 (t=2) | | |
|---|---|---|---|---|---|---|---|---|---|---|---|---|---|---|---|
| DRAM0 | DATA OUTPUT | | | | | | | | | | | delay | DATA OUTPUT | | |
| | Read0 | Read1 | Read2 | Read3 | Read4 | Read5 | Read6 | Idle | Ref0 | Ref1 | Idle | | Idle | Read12 | Read13 | Idle |
| DRAM1 | Refresh, Idle | | | | | | | | | | | delay | Refresh, Idle | | |
| | Idle | Ref0 | Ref1 | | | | Idle | Read7 | Read8 | Read9 | Read10 | Read11 | Idle | | Ref0 | Ref1 |

Figure 3

DEVICE AND METHOD FOR ACHIEVING SRAM OUTPUT CHARACTERISTICS FROM DRAMS

CROSS-REFERENCE TO RELATED PATENT APPLICATIONS

This application is a continuation application under 35 U.S.C. §365(c) of International Application No. PCT/KR2010/003151, filed May 19, 2010 designating the United States. International Application No. PCT/KR2010/003151 was published in English as WO2010/137819 A2 on Dec. 2, 2010. This application further claims the benefit of the earlier filing date under 35 U.S.C. §365(b) of Korean Patent Application No. 10-2009-0045298 filed May 25, 2009. This application incorporates herein by reference International Application No. PCT/KR2010/003151 including International Publication No. WO2010/137819 A2 and Korean Patent Application No. 10-2009-0045298 in their entirety.

BACKGROUND

1. Field

The present disclosure relates to a method and apparatus for employing dynamic random access memory (DRAM) to implement static random access memory (SRAM) output operations.

2. Discussion of Related Technology

Dynamic random access memory (DRAM) is slower and much less expensive per storage cell than static random access memory (SRAM). In addition, because each storage cell is simple, DRAM has a much higher storage density than SRAM and is generally used as main memory in computers. On the contrary, SRAM is faster, but more expensive than DRAM and is generally used for speed-critical areas of the computer such as cache memory or buffer memory.

An advantage of DRAM is structural simplicity: only one transistor and capacitor are required per memory cell. This allows DRAM to reach very high densities at low cost. However, the disadvantage is that since each memory cell stores bit information by charging each cell storage capacitor to a desired voltage value, DRAM must be constantly refreshed.

Each memory cell in SRAM includes a pair of cross-coupled transistors and a pair of access transistors serving to control access to the memory cell during read and write operations. This increases circuit complexity and makes SRAM more expensive than DRAM. However, SRAM does not need to be periodically refreshed, thereby allowing a CPU or other units to access the SRAM without interrupt.

That is, DRAM must be periodically refreshed, thereby causing delay when accessed. Hence, when fast access to memory is critical, SRAM is used despite the disadvantages of SRAM in terms of degree of integration, cost, and power consumption.

In order to use DRAM to overcome the disadvantages of SRAM, a technology for employing a plurality of DRAM chips to implement SRAM output operations has been presented. More specifically, one of the DRAM chips is operated while others are refreshed, thereby effectively operating as SRAM through elimination of delay related to the refresh operation.

Korean Patent No. 10-0796179 discloses a method and system for masking DRAM refresh operations. Specifically, in order to prevent delay caused by refresh of DRAM during read and write operations and to replace conventional SRAM, two DRAM arrays are used, and circuits are added or modified on control and data paths of conventional DRAM and are provided on a semiconductor wafer. However, this technology is complicated and thus can only be implemented on the semiconductor wafer.

Japanese Patent Application Publication Nos. 2003-297082 and 2008-257742 disclose a technology of using two DRAM to replace SRAM. This technology can employ general chip- or die-type DRAM. However, since the two DRAM chips need to be independently controlled, the device is complicated in structure and an extra delay is needed in data processing. Besides, since two DRAM chips are independently operated, each of the DRAM chips needs a controller, a data bus and an address bus, thereby causing data mismatch between the two DRAM chips. In particular, an increased data width may increase device complexity, and a dedicated controller chip may be needed. In this case, it's unlikely that this technology will be applied to low volume production.

Since the aforementioned conventional technologies using two DRAM chips require a data bus and an address bus dedicated to each DRAM, circuit complexity is high and data mismatch occurs between the two DRAM chips. Hence, a variety of supplemental circuits are used to overcome these problems.

The discussion in this section is to provide general background information and does not constitute and admission of prior art.

SUMMARY

Provided are a method and system for employing DRAM to implement SRAM output operations by allowing a controller to control a plurality of DRAM interconnected in parallel and sharing a data bus and an address bus to be sequentially alternately operated in refresh/standby mode and in data output mode.

One aspect of the invention provides an apparatus for employing dynamic random access memory (DRAM) to implement static random access memory (SRAM) output operations includes: a plurality of DRAM interconnected in parallel and sharing a data bus and an address bus; and a controller being connected in parallel with the plurality of DRAM, transmitting a data control signal to one of the plurality of DRAM to be operated in data output mode while transmitting a refresh/standby control signal to others to be operated in refresh/standby mode, reading data from the DRAM which is in the data output mode, and transmitting the data to an external device, the data control signal being transmitted to the plurality of DRAM in a sequential manner, the plurality of DRAM not performing write/read operations independently and the data of the plurality of DRAM being always identical. When receiving a data write request signal from the external device, the controller simultaneously writes the data to the plurality of DRAM.

Another aspect of the invention provides a memory apparatus comprising: a plurality of DRAMs; a data bus connected in parallel to the plurality of DRAMs; an address bus connected in parallel to the plurality of DRAMs; and a common controller configured to control reading and writing of data to and from all of the plurality of DRAMs, wherein the apparatus does not comprise a single-DRAM-dedicated controller dedicated to a single one of the plurality of DRAMs for controlling operations of the single DRAM. In the memory apparatus, upon receiving a data read request from an external device, the common controller is configured to set a first one of the plurality of DRAMs to an output mode to output data to the data bus and further to set the other ones of the plurality of DRAMs to a standby/refresh mode while the first DRAM is in the output mode. Further, upon receiving a data write request from an external device, the common controller is configured to set the plurality of DRAMs to a write mode to write data from the common data bus simultaneously in all of the plurality of DRAMs. In the foregoing apparatus, subsequent to the first DRAM's output mode, the common controller may be further configured to set a second one of the plurality of DRAMs to the output mode to output data to the data bus and further to set the other ones of the plurality of DRAMs to the standby/refresh mode while the second DRAM is in the output mode.

Another aspect of the invention provides a method of operating a memory apparatus. The method comprises: providing the above-described apparatus that is connected to an external device external to the apparatus; receiving, by the apparatus, a data read request from the external device; sending, by the common controller, a first read control signal to the first DRAM and a standby/refresh control signal to the other ones of the plurality of DRAMs, wherein in response to the control signals, the first DRAM outputs data to the data bus and the other DRAMs stay in a standby/refresh mode while the first DRAM outputs data; receiving, by the apparatus, a data write request from the external device; and sending, by the common controller, a write control signal to all of the plurality of DRAMs, wherein in response to the write control signal, the plurality of DRAMs write data provided from the external device. In the foregoing method, subsequent to sending the read control signal to the first DRAM, the common controller may send a second read control signal to a second one of the plurality of DRAMs and may further send a standby/refresh control signal to the other ones of the plurality of DRAMs, wherein in response thereto, the second DRAM outputs data to the data bus and the other DRAMs stay in a standby/refresh mode while the second DRAM outputs data. Also in the foregoing method, in response to the write control signal, the data from the external device may be written simultaneously to all of the plurality of DRAMs directly without temporarily storing the data in a buffer memory. Further in the foregoing method, in response to the write control signal, the data from the external device may be written simultaneously to all of the plurality of DRAMs but after temporarily storing the data in a buffer memory. Additionally in the foregoing method, during the standby/refresh mode, each DRAM may first refresh itself and then remain in a standby state. Moreover, in the foregoing method, each of DRAM may be selected from the group consisting of Synchronous DRAM (SDRAM), Rambus DRAM (RDRAM), Synchronous Link DRAM (SLDRAM) and Reduced Latency DRAM (RLDRAM).

According to another aspect of the invention, a method for employing DRAM to implement SRAM output operations includes: connecting a plurality of DRAM sharing a data bus and an address bus in parallel to a controller; the controller simultaneously writing data to the plurality of DRAM upon receiving a data write request signal from an external device, the plurality of DRAM not performing write/read operations independently and the data of the plurality of DRAM being always identical; when the controller receives a data read request signal from the external device, the controller transmitting a data control signal to one of the plurality of DRAM to be operated in data output mode while transmitting a refresh/standby control signal to other DRAM to be operated in refresh/standby mode; reading data from the DRAM which is in the data output mode and transmitting the data to the external device; transmitting the refresh/standby control signal to the DRAM which is in the data output mode and transmitting the data control signal to one of the other DRAM which are in the refresh/standby mode; and sequentially repeating the reading of the data from the DRAM which is in the data output mode and the transmitting of the refresh/standby control signal to the DRAM which is in the data output mode to output the data to the external device.

Upon receiving a data write request signal from the external device, the controller may be operated to write data directly to the plurality of DRAM interconnected in parallel or indirectly to buffer memories.

The refresh/standby mode may indicate that the DRAM is refreshed and then remains in standby.

The method and apparatus according to the present disclosure may employ DRAM to implement SRAM output operations by allowing the controller to control a plurality of DRAM interconnected in parallel to sequentially alternate between refresh/standby mode and data output mode. Hence, the method and apparatus according to the present disclosure are advantageous in terms of degree of integration, cost and power consumption, as compared to SRAM.

In addition, by applying the technology according to the present disclosure to apparatuses that would conventionally employ SRAM, it is possible to miniaturize the apparatus, reduce manufacturing costs, and shorten development periods.

Further, the method and apparatus according to the present disclosure make it possible to implement SRAM output operations using general DRAM (devices, modules, DIE) on a printed circuit board or similar substrate.

BRIEF DESCRIPTION OF THE DRAWINGS

These and other features, aspects, and advantages of embodiments of the present disclosure will be more fully described in the following detailed description, taken with the accompanying drawings. In the drawings:

FIG. 2 illustrates a table showing a method employing DRAM to implement SRAM output operations according to an embodiment of the present disclosure; and FIG. 3 illustrates a table showing a method employing DRAM to implement SRAM output operations according to an embodiment of the present disclosure.

DETAILED DESCRIPTION

Figure 1:
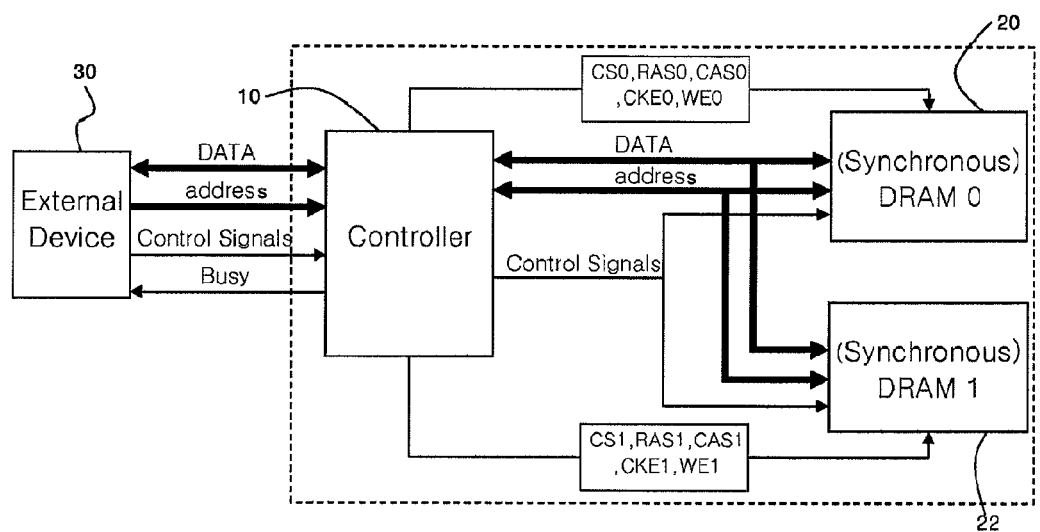
FIG. 1 is a block diagram of an apparatus employing DRAM to implement SRAM output operations according to an embodiment of the present disclosure.

Embodiments of the present disclosure will now be described in detail with reference to the accompanying drawings.

FIG. 1 is a block diagram of an apparatus employing DRAM to implement SRAM output operations according to an embodiment of the present disclosure. The apparatus includes a controller 10 and DRAM 20 and 22 interconnected in parallel. The DRAM 20 and 22 are connected in parallel with the controller 10. The controller 10 is connected to an external device 30. The controller 10 sends a data control signal to the DRAM 20 to be operated in data output mode and sends a refresh/standby control signal to the DRAM 22 to be operated in refresh/standby mode. The data control signal is sent to the DRAM 20 and 22 in a sequential manner. The DRAM 20 and 22 share a data bus and an address bus. The controller 10 reads data from the DRAM 20 which is in data output mode, and sends the data to the external device 30. Although the DRAM 20 and 22 are connected in parallel with the controller 10 in FIG. 1, three or more DRAM may be connected in parallel with the controller 10.

Examples of the DRAM 20 or 22 include Synchronous DRAM (SDRAM), Rambus DRAM (RDRAM), Synchronous Link DRAM (SLDRAM) and Reduced Latency DRAM (RLDRAM).

A method for employing the DRAM to implement SRAM output operations using the apparatus according to an embodiment of the present disclosure will be described.

The DRAM 20 and 22 are connected in parallel with the controller 10. The DRAM 20 and 22 share a data bus and an address bus.

When receiving a data read request signal from the external device 30, the controller 10 sends the data control signal to the DRAM 20 to be operated in data output mode and sends the refresh/standby control signal to the DRAM 22 to be operated in refresh/standby mode. The controller 10 then reads data from the DRAM 20 and sends the data to the external device 30. After a predetermined time (i.e., period), the controller 10 sends the refresh/standby control signal to the DRAM 20 which has been in data output mode, and sends the data control signal to the DRAM 22 which has been in refresh/standby mode. The controller 10 sequentially alternates between reading of the data from the DRAM 20 which is in data output mode and sending of a control signal to switch the DRAM 20 from the data output mode to the refresh/standby mode so as to output the data to the external device 30. The data output mode indicates that the data is being read or is ready to be read upon request. The refresh/standby mode indicates that the DRAM 20 or 22 is refreshed and then remains in a standby state.

FIGS. 2 and 3 illustrate tables showing the method for employing DRAM to implement SRAM output operations according to an embodiment of the present disclosure.

For instance, data is read from the DRAM 20 and then output at period 0 (t=0), data is read from the DRAM 22 and then output at period 1 (t=1), data is read again from the DRAM 20 and then output at period 2 (t=2), and data is read again from the DRAM 22 and then output at period 3 (t=3). This process is repeated to output the data.

That is, the DRAM 20 outputs data at period 0 (t=0), is refreshed and then remains in a standby state at period 1 (t=1), outputs data at period 2 (t=2), and is refreshed and then remains in the standby state at period 3 (t=3). This constitutes normal operation of DRAM.

Similarly, the DRAM 22 is refreshed and then remains in the standby state at period 0 (t=0), outputs data at period 1 (t=1), is refreshed and then remains in the standby state at period 2 (t=2), and outputs data at period 3 (t=3). The DRAM 21 or 22 repeats such a normal operation of DRAM.

Although each of the DRAM 20 and 22 interconnected in parallel performs a normal operation of DRAM, the data is output without delay from the DRAM 20 and 22 to the external device 30 through the controller 10. Accordingly, it is possible to employ the DRAM to implement the same continuous high-speed output operations as provided by SRAM. The plurality of DRAM does not perform write/read operations independently. Furthermore, since the plurality of DRAM is connected in parallel with the controller, the data from the plurality of DRAM are identical. Accordingly, no additional device, such as extra memory for data correction or a module for data flow control, is required. Furthermore, with advanced DRAM technologies, it is possible to employ higher-speed DRAM to implement SRAM output operations.

On the other hand, when receiving a data write request signal from the external device 30, the controller 10 sends a data write control signal to the DRAM 20 and 22 to write data directly thereto or indirectly to a buffer memory (not shown).

Although some embodiments of the method and apparatus for employing DRAM to implement SRAM output operations have been described above, it will be apparent to those skilled in the art that the embodiments are given by way of illustration only, and that various modifications, changes, and alterations, can be made without departing from the spirit and scope of the present disclosure. Accordingly, other implementations are within the scope of the following claims.

What is claimed is:

1. A memory apparatus comprising:
   a plurality of DRAMs;
   a data bus connected in parallel to the plurality of DRAMs;
   an address bus connected in parallel to the plurality of DRAMs; and
   a common controller configured to control reading and writing of data to and from all of the plurality of DRAMs, wherein the apparatus does not comprise a single-DRAM-dedicated controller dedicated to a single one of the plurality of DRAMs for controlling operations of the single DRAM,
   wherein, upon receiving a data read request from an external device, the common controller is configured to set a first one of the plurality of DRAMs to an output mode to output data to the data bus and further to set the other ones of the plurality of DRAMs to a standby/refresh mode while the first DRAM is in the output mode,
   wherein, upon receiving a data write request from an external device, the common controller is configured to set the plurality of DRAMs to a write mode to write data from the data bus simultaneously in all of the plurality of DRAMs.

2. The memory apparatus of claim 1, wherein subsequent to the first DRAM's output mode, the common controller is further configured to set a second one of the plurality of DRAMs to the output mode to output data to the data bus and further to set the other ones of the plurality of DRAMs to the standby/refresh mode while the second DRAM is in the output mode.

3. A method of operating a memory apparatus, the method comprising:
   providing the apparatus of claim 1 connected to an external device external to the apparatus;
   receiving, by the apparatus, a data read request from the external device;
   sending, by the common controller, a first read control signal to the first DRAM and a refresh/standby control signal to the other ones of the plurality of DRAMs, wherein in response to the control signals, the first DRAM outputs data to the data bus and the other DRAMs stay in a standby/refresh mode while the first DRAM outputs data;
   receiving, by the apparatus, a data write request from the external device; and
   sending, by the common controller, a write control signal to all of the plurality of DRAMs, wherein in response to the write control signal, the plurality of DRAMs write data provided from the external device.

4. The method of claim 3, wherein subsequent to sending the read control signal to the first DRAM, the common controller sends a second read control signal to a second DRAM and further sends standby/refresh control signal to the other ones of the plurality of DRAMs, wherein in response thereto, the second DRAM outputs data to the data bus and the other DRAMs stay in a standby/refresh mode while the second DRAM outputs data.

5. The method of claim 3, wherein in response to the write control signal, the data from the external device is written simultaneously to all of the plurality of DRAMs directly without temporarily storing the data in a buffer memory.

6. The method of claim 3, wherein in response to the write control signal, the data from the external device is written simultaneously to all of the plurality of DRAMs but after temporarily storing the data in a buffer memory.

7. The method of claim 3, wherein during the standby/refresh mode, each DRAM is first refreshed and then remains in a standby state.

8. The method of claim 3, wherein each of DRAM is one selected from the group consisting of Synchronous DRAM (SDRAM), Rambus DRAM (RDRAM), Synchronous Link DRAM (SLDRAM) and Reduced Latency DRAM (RLDRAM).

9. The method of claim 3, wherein the common controller sends the refresh/standby control signal to the first DRAM subsequent to the first DRAM outputting data to the data bus, wherein subsequent to sending the refresh/standby control signal to the first DRAM the common controller outputs the data from the data bus to the external device.

* * * * *